(12) United States Patent
Shih

(10) Patent No.: US 10,770,424 B1
(45) Date of Patent: Sep. 8, 2020

(54) SEMICONDUCTOR STRUCTURE AND METHOD OF MANUFACTURING THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/540,037

(22) Filed: Aug. 13, 2019

(51) Int. Cl.
  *H01L 23/00* (2006.01)
  *H01L 25/065* (2006.01)
  *H01L 25/00* (2006.01)

(52) U.S. Cl.
  CPC ............ *H01L 24/80* (2013.01); *H01L 23/562* (2013.01); *H01L 24/08* (2013.01); *H01L 25/0657* (2013.01); *H01L 25/50* (2013.01); *H01L 2224/0219* (2013.01); *H01L 2224/08145* (2013.01); *H01L 2224/8002* (2013.01); *H01L 2224/8012* (2013.01); *H01L 2224/80051* (2013.01); *H01L 2224/80895* (2013.01); *H01L 2224/80896* (2013.01); *H01L 2225/06524* (2013.01); *H01L 2924/35121* (2013.01)

(58) Field of Classification Search
  CPC ....... H01L 24/80; H01L 23/562; H01L 24/08; H01L 25/0657; H01L 25/50
  USPC .......................................................... 257/777
  See application file for complete search history.

(56) References Cited

U.S. PATENT DOCUMENTS

2020/0043908 A1* 2/2020 Chung ................ H01L 21/4853

* cited by examiner

*Primary Examiner* — Elias Ullah
(74) *Attorney, Agent, or Firm* — CKC & Partners Co., LLC

(57) ABSTRACT

A semiconductor structure includes a first component and a second component bonded thereof. The first component includes a first dielectric layer, a first conductive structure, and a first filling material layer. The first conductive structure is in the first dielectric layer and includes a first conductive line and a first conductive pad thereon. The first filling material layer is on the first conductive line and surrounds the first conductive pad. The second component includes a second dielectric layer, a second conductive structure, and a second filling material layer. The second dielectric layer is bonded to the first dielectric layer. The second conductive structure is in the second dielectric layer, and includes a second conductive pad bonded to the first conductive pad. The second filling material layer surrounds the second conductive pad and in contact with a second conductive line on the second conductive pad.

16 Claims, 7 Drawing Sheets

SEMICONDUCTOR STRUCTURE AND METHOD OF MANUFACTURING THEREOF

BACKGROUND

Field of Invention

The present invention relates to a semiconductor structure and method of manufacturing thereof.

Description of Related Art

Various bonding methods have been developed to bond two components such as wafer to wafer bonding. In the hybrid bonding, the metal pads have higher coefficients of thermal expansion (CTEs) than the surrounding dielectric layers at the surfaces of the bonded wafers. This results in problems for the bonding of the surface dielectric layers. Further, structural instability and some defects may occur owing to a thermal stress induced by the large mismatch of CTEs.

SUMMARY

In accordance with an aspect of the present invention, a semiconductor structure is provided. The semiconductor structure includes a first component and a second component bonded thereof. The first component includes a first dielectric layer, a first conductive structure, and a first filling material layer. The first conductive structure is in the first dielectric layer and includes a first conductive line and a first conductive pad on the first conductive line. The first filling material layer is on the first conductive line and surrounding the first conductive pad. The second component includes a second dielectric layer, a second conductive structure, and a second filling material layer. The second dielectric layer is bonded to the first dielectric layer. The second conductive structure is in the second dielectric layer, and includes a second conductive pad bonded to the first conductive pad and a second conductive line on the second conductive pad. The second filling material layer surrounds the second conductive pad and in contact with the second conductive line.

According to some embodiments of the present invention, the first conductive pad and the second conductive pad respectively have a width that is smaller than a width of the first conductive line and the second conductive line.

According to some embodiments of the present invention, the first conductive pad is aligned with the second conductive pad, and the first filling material layer is aligned with the second filling material layer.

According to some embodiments of the present invention, a top surface of the first filling material layer, a top surface of the first conductive pad, a bottom surface of the second filling material layer, and a bottom surface of the second conductive pad are coplanar.

According to some embodiments of the present invention, the semiconductor structure further includes an air gap between the first filling material layer and the second filling material layer.

According to some embodiments of the present invention, the first filling material layer and the second filling material layer respectively have a width of about 0.1-2 μm.

According to some embodiments of the present invention, the first filling material layer and the second filling material layer respectively include soft material.

According to some embodiments of the present invention, the first filling material layer and the second filling material layer respectively include carbon contained material.

According to some embodiments of the present invention, the semiconductor structure further includes an active device electrically connected to the first conductive structure.

In accordance with another aspect of the present invention, a method of manufacturing a semiconductor structure is provided. The method includes forming a first component, forming a second component, and bonding the first component to the second component. The first component includes a first dielectric layer, a first conductive structure in the first dielectric layer, wherein the first conductive structure includes a first conductive line and a first conductive pad on the first conductive line, and a first filling material layer surrounding the first conductive pad and in contact with the first conductive line. The second component includes a second dielectric layer, a second conductive structure in the second dielectric layer, wherein the second conductive structure includes a second conductive line and a second conductive pad on the second conductive line, and a second filling material layer surrounding the second conductive pad and in contact with the second conductive line. The first conductive pad is bonded to the second conductive pad, and the first dielectric layer is bonded to the second dielectric layer.

According to some embodiments of the present invention, the first conductive pad and the second conductive pad respectively have a width that is smaller than a width of the first conductive line and the second conductive line.

According to some embodiments of the present invention, bonding the first component to the second component includes aligning the first conductive pad with the second conductive pad, and aligning the first filling material layer with the second filling material layer.

According to some embodiments of the present invention, the first filling material layer has a top surface that is level with a top surface of the first conductive pad, and the second filling material layer has a top surface that is level with a top surface of the second conductive pad.

According to some embodiments of the present invention, the first filling material layer has a height that is smaller than a height of the first conductive pad, and the second filling material layer has a height that is smaller than a height of the second conductive pad.

According to some embodiments of the present invention, forming the first component includes forming a first precursor structure includes a first dielectric material and the first conductive structure in the first dielectric material, wherein the first dielectric material has a first surface that is level with a top surface of the first conductive pad; etching a first dielectric material to form a first groove surrounding the first conductive pad and exposing a top surface of the first conductive line; filling the first groove with a first filling material; and removing a portion of the first filling material to form the first filling material layer.

According to some embodiments of the present invention, forming the second component includes forming a second precursor structure includes a second dielectric material and the second conductive structure in the second dielectric material, wherein the second dielectric material has a second surface that is level with a top surface of the second conductive pad; etching a second dielectric material to form a second groove surrounding the second conductive pad and exposing a top surface of the second conductive line; filling the second groove with a second filling material; and removing a portion of the second filling material to form the second filling material layer.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
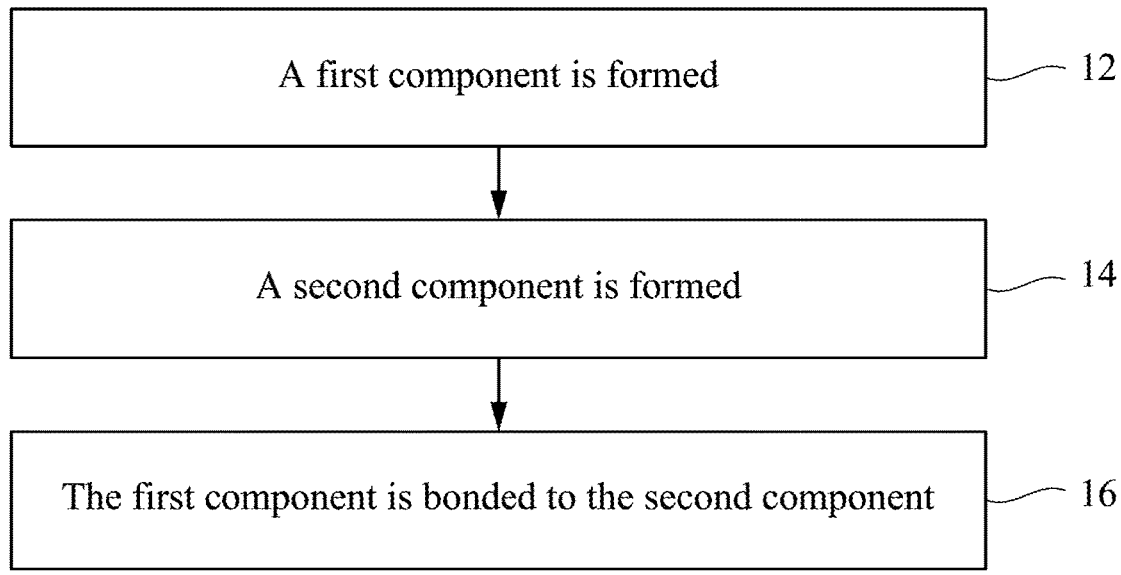
FIG. 1 is a flow chart illustrating a method of manufacturing a semiconductor structure in accordance with some embodiments of this invention.

FIG. 1 is a flow chart illustrating a method of manufacturing a semiconductor structure in accordance with some embodiments of this invention. As shown in FIG. 1, the method 10 includes operation 12, operation 14, and operation 16. FIGS. 2-10 are cross-sectional views at various stages of method 10 according to some embodiments of the present disclosure.

Please refer to FIG. 1, in the operation 12 of the method 10, a first component 101 is formed. FIGS. 2-6 illustrate the detail steps of implementing operation 12 in accordance with an embodiment of the present disclosure.

Figure 2:
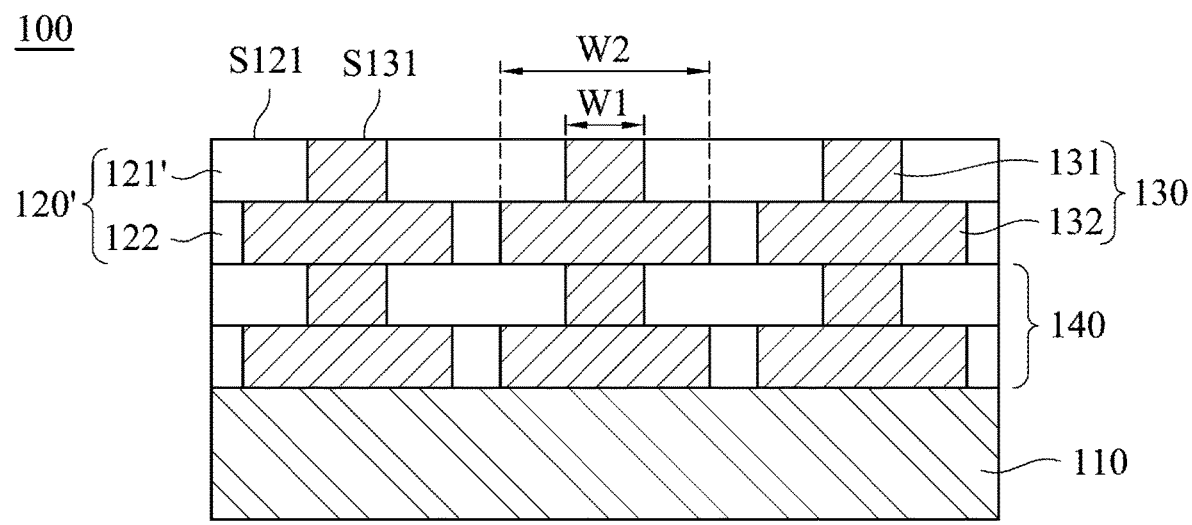
FIG. 2 to FIG. 6 are cross-sectional views of various intermediary stages in the manufacturing of semiconductor structure in accordance with some embodiments of this invention.

Please refer to FIG. 2, a first precursor structure 100 is formed. The first precursor structure 100 may comprise a first substrate 110, a first dielectric material 120', and a first conductive structure 130. In some embodiments, the first substrate 110 may be semiconductor substrate, such as a silicon substrate, a silicon germanium substrate, a silicon carbon substrate, an III-V compound semiconductor substrate, or the like. In some embodiments, the first substrate 110 may include one or more active device (not shown) such as transistor.

As shown in FIG. 2, the first dielectric material 120' is disposed on the first substrate 110. The first dielectric material 120' may include dielectric materials 121' and 122 which may be made of same material. In some embodiments, the first dielectric material 120' may include silicon oxide, silicon carbide, silicon nitride, silicon oxynitride, or the like.

The first conductive structure 130 is disposed in the first dielectric material 120'. In some embodiments, the first conductive structure 130 may include conductive material, such as copper, aluminum, tungsten, nickel, or alloys thereof. As shown in FIG. 2, the first conductive structure 130 includes a first conductive pad 131 and a first conductive line 132. The first conductive pad 131 is disposed on the first conductive line 132. Specifically, the first conductive pad 131 is embedded in the dielectric material 121', and the first conductive line 132 is embedded in the dielectric material 122. In some embodiments, the first conductive pad 131 has a width W1 that is smaller than a width W2 of the first conductive line 132. In some embodiments, the first conductive pad 131 has a top surface S131, the first dielectric material 120' has a first surface S121, and the first surface S121 is level with the top surface S131.

In some embodiments, the first precursor structure 100 may further include a interconnect structure 140 disposed between the first conductive structure 130 and the first substrate 110. The first conductive structure 130 can be electrically connected to the first substrate 110 through the interconnect structure 140. For example, the first conductive structure 130 can be electrically connected to the active device (not shown) of the first substrate 110 by the interconnect structure 140. It is understood that the configuration of the first conductive structure 130 and the interconnect structure 140 shown in FIG. 2 is merely an example, and is not intended to limit the present disclosure.

Figure 3:
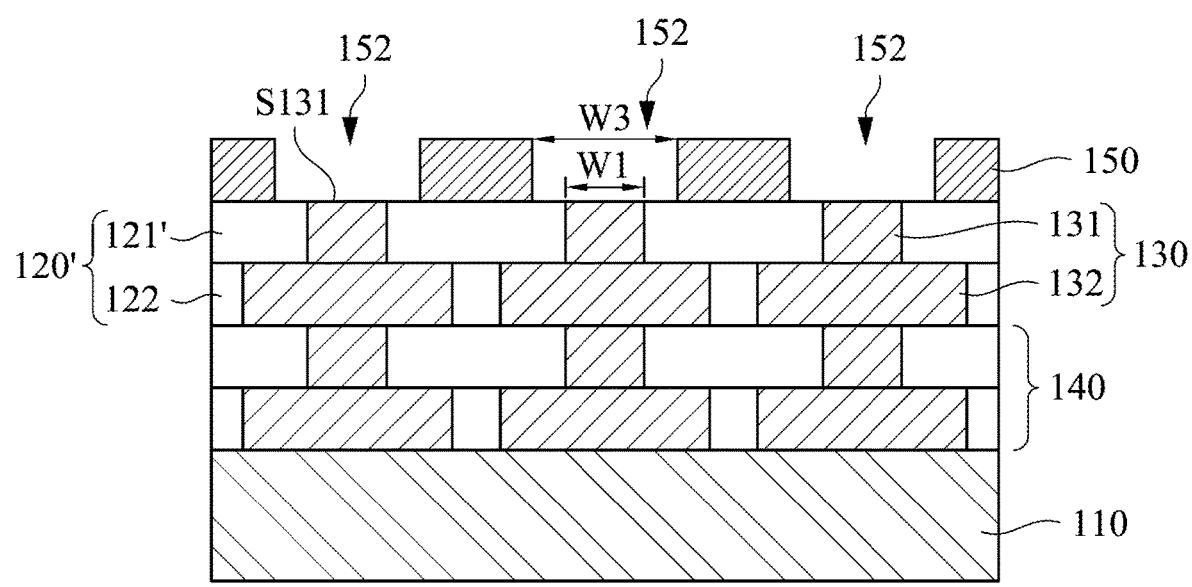

Referring to FIG. 3, a photoresist layer 150 is formed on the first precursor structure 100. The photoresist layer 150 has an opening 152 exposing the top surface S131 of the first conductive pad 131. In some embodiments, the opening 152 has a width W3 that is greater than the width W1 of the first conductive pad 131. That is, the opening 152 exposes entire top surface S131 of the first conductive pad 131.

Figure 4:
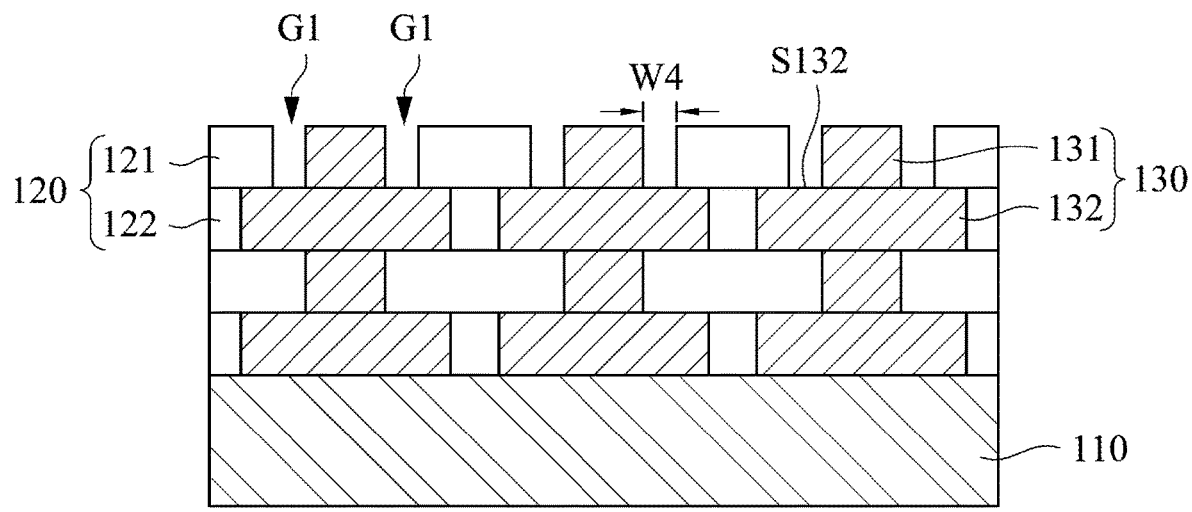

Referring to FIG. 4, a first dielectric material 120' is etched to form a first groove G1 surrounding the first conductive pad 131 and exposing a top surface S132 of the first conductive line 132. The first groove G1 may be formed by suitable etching method such as anisotropic etching. After forming the first groove G1, the photoresist layer 150 shown in FIG. 3 is removed. Specifically, the first groove G1 is formed in the dielectric layer 121 of the first dielectric layer 120. The first conductive pad 131 is encircled by the first groove G1. In some embodiments, the first groove G1 has width W4 of about 0.1-2 μm. For example, the width W4 of the first groove G1 may be 0.2, 0.5, 0.7, 1.0 1.2, 1.5, 1.8, or 1.9 μm.

Figure 5:
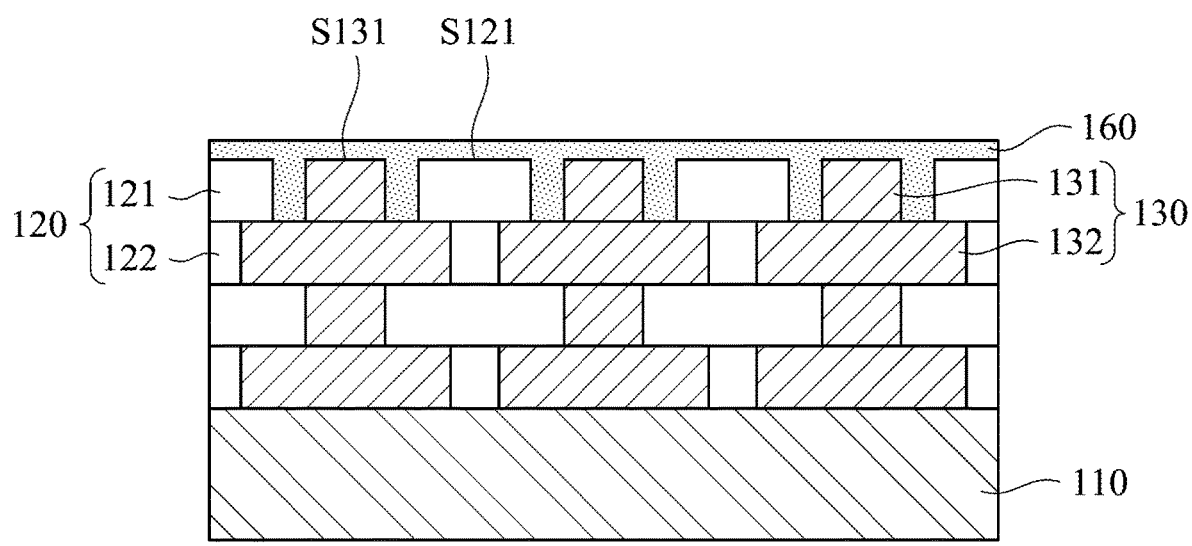

Referring to FIG. 5, the first groove G1 is filled with a first filling material 160. In some embodiments, the first filling material 160 may include soft material. In some examples, the first filling material 160 may include carbon contained material, such as benzocyclobutene (BCB), but is not limited thereto. In some embodiments, the first filling material 160 has a coefficient of thermal expansion (CTE) between the CTE of first dielectric layer 120 and the first conductive structure 130. In other embodiments, the first filling material 160 has a coefficient of thermal expansion (CTE) greater than the CTE of the first conductive structure 130 which includes metal material. The first filling material 160 may be formed, for example, using chemical vapor deposition (CVD), physical vapor deposition (PVD), atomic layer deposition (ALD), or the like. As shown in FIG. 5, the first filling material 160 may cover the first surface S121 of the first dielectric layer 120 and the top surface S131 of the first conductive pad 131.

Figure 6:
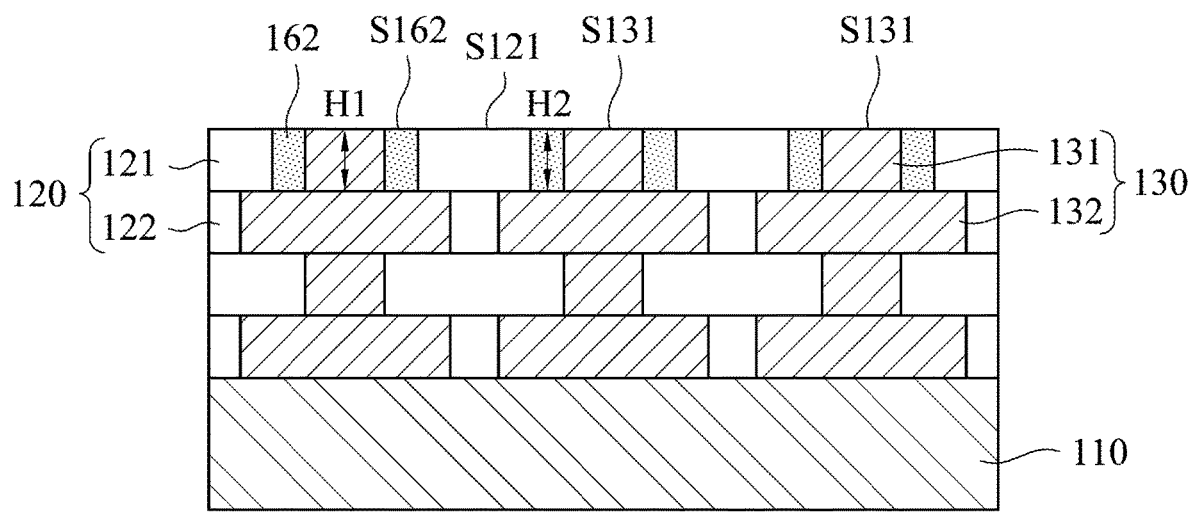

Referring to FIG. 6, a portion of the first filling material 160 is removed to form the first filling material layer 162. In some embodiments, a portion of the first filling material 160 is removed by a planarization process such as a chemical mechanical polish (CMP) to expose the first surface S121 and the top surface S131. In some embodiments, the first filling material layer 162 has a top surface S162 that is level with a top surface S131 of the first conductive pad 131. Specifically, the top surfaces S121, S131, S162 are coplanar. That is, the first filling material layer 162 has a height H2 that is substantially equal to a height H1 of the first conductive pad 131. In other embodiments, a top portion of the first filling material 160 in the first groove G1 is further removed after the planarization process. Therefore, a height of the first filling material layer 162 may be smaller than the height H1 of the first conductive pad 131.

Figure 7:
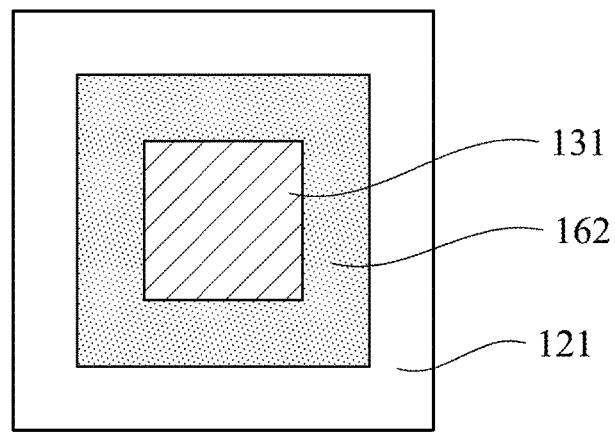
FIG. 7 is a top view of the semiconductor structure shown in FIG. 6 in accordance with some embodiments of this invention.

As shown in FIG. 6, the first component 101 is formed. The first component 101 includes the first dielectric layer 120, the first conductive structure 130, and the first filling material layer 162. The first dielectric layer 120 is on the first substrate 110. The first conductive structure 130 is disposed in the first dielectric layer 120 and includes the first conductive line 132 and a first conductive pad 131 on the first conductive line 132. The first filling material layer 162 is filled in the first groove G1 (shown in FIG. 5) and in contact with the first conductive line 132. FIG. 7 is a top view of the first component 101 shown in FIG. 6. As shown in FIG. 7, the first filling material layer 162 surrounds the first conductive pad 131, and the first dielectric layer 121 surrounds the first filling material layer 162. It is noted that the contour of the first conductive pad 131, the first filling material layer 162, and the first dielectric layer 121 in top view shown in FIG. 7 is merely an example, and is not intended to limit the present disclosure.

Figure 8:
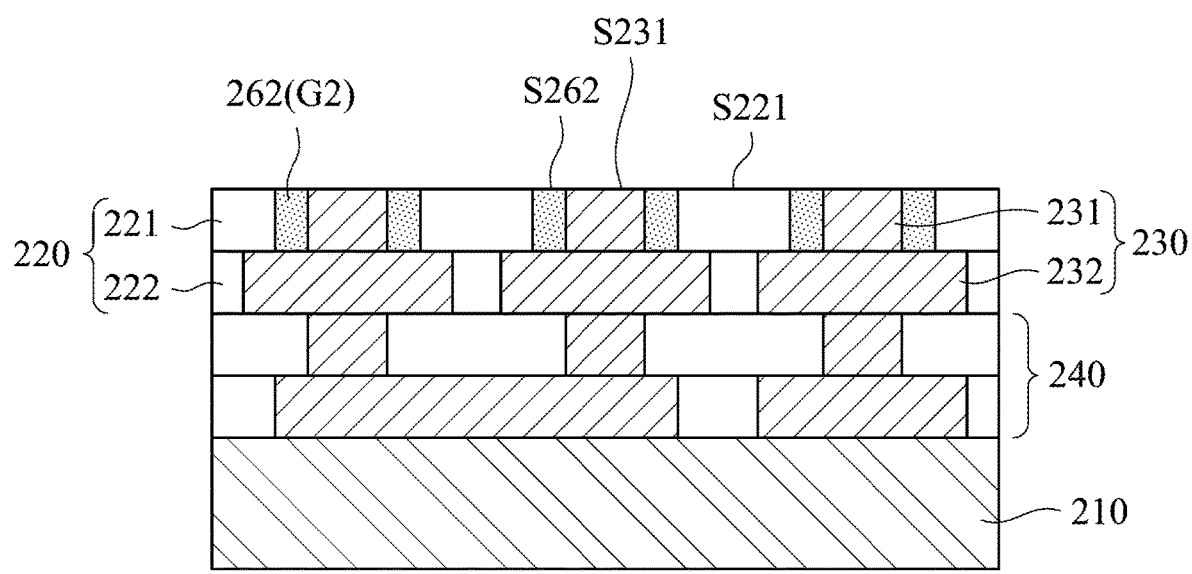
FIG. 8 to FIG. 10 are cross-sectional views of various intermediary stages in the manufacturing of semiconductor structure in accordance with some embodiments of this invention.

Next, please refer to FIG. 1 and FIG. 8, the method 10 proceeds to operation 14, wherein a second component is formed. FIG. 8 is a cross-sectional view of a second component 201. The second component 201 may have a structure and a manufacturing process same as or similar to the first component 101 shown in FIG. 6, and the details of the material and formation process are not repeated herein. The features in the second component 201 may be found referring to the like features in the first component 101, with the like features in the first component 101 starting with number "1," which features correspond to the features in the second component 201 and having reference numerals starting with number "2." For example, as shown in FIG. 8, the second component 201 may include a second substrate 210, a second dielectric layer 220, a second conductive structure 230, a second interconnect structure 240, and a second filling material layer 262. The second dielectric layer 220 may include dielectric layers 221 and 222. The second conductive structure 230 is in the second dielectric layer 220. The second conductive structure 230 includes a second conductive line 232 and a second conductive pad 231 on the second conductive line 232. In some embodiments, the second conductive pad 231 has a width that is smaller than a width of the second conductive line 232. In some embodiments, the widths of the second conductive pad 231 and the second conductive line 232 may be respectively same as the first conductive pad 131 and the first conductive line 132. The second filling material layer 262 is filled in the second grooves G2 surrounding the second conductive pad 231 and is in contact with the second conductive line 232. In some embodiments, the second filling material layer 262 has a top surface S262 that is level with a top surface S231 of the second conductive pad 231. That is, the top surfaces S221, S231, S262 are coplanar. In other embodiments, the second filling material layer 262 has a height that is smaller than a height of the second conductive pad 231. That is, the second filling material layer 262 may expose a portion of a sidewall of the second conductive pad 231.

Figure 9:
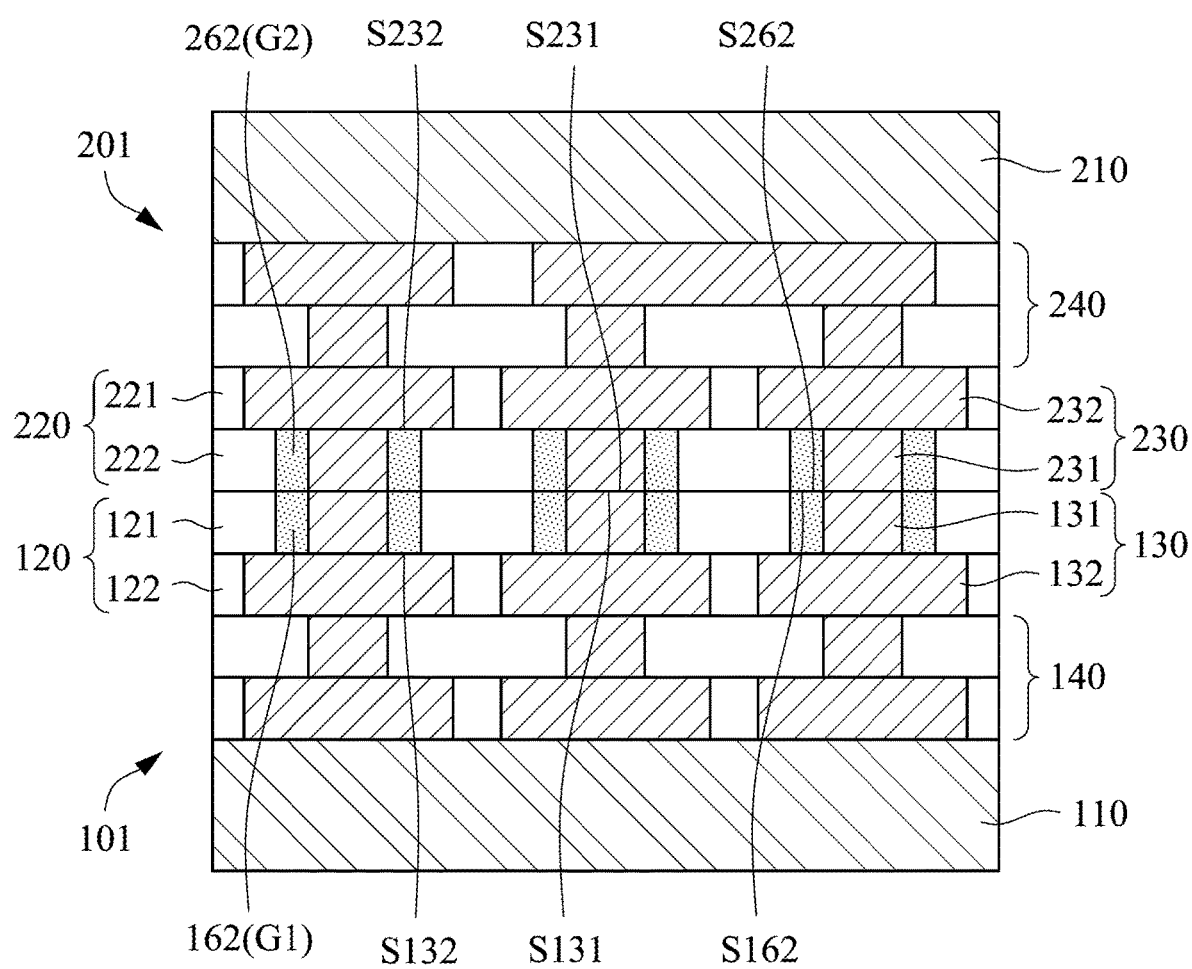

Next, referring to FIG. 1 and FIG. 9, in operation 16 of method 10, the first component is bonded to the second component. As show in FIG. 9, the second component 201 shown in FIG. 8 is flipped and bonded to the first component 101. Specifically, the first conductive pad 131 is bonded to the second conductive pad 231, and the first dielectric layer 120 is bonded to the second dielectric layer 220. In some embodiments, the first conductive pad 131 and the first filling material layer 162 of the first component 101 are respectively aligned with the second conductive pad 231 and the second filling material layer 262 of the second component 201, and the second component 201 is then pressed against the first component 101. The first component 101 may be bonded to the second component 201 through fusion bonding process and thermal compression bonding, but is not limited thereto. For example, the first dielectric layer 120 and the second dielectric layer 220 may be bonded to each other through fusion bonds, and the first conductive pad 131 and the second conductive pad 231 may be bonded to each other through metal bonds.

After performing operation 16, the semiconductor structure 300 is formed. The semiconductor structure 300 shown in FIG. 9 includes a first component 101 and a second component 201 bonded to the first component 101. The first component 101 includes the first dielectric layer 120, the first conductive structure 130, the first groove G1, and the first filling material layer 162. The first conductive structure 130 is disposed in the first dielectric layer 120, and includes the first conductive line 132 and the first conductive pad 131 on the first conductive line 132. The first groove G1 is in the first dielectric layer 120. The first groove G1 surrounds the first conductive pad 131 and exposes a top surface S132 of the first conductive line 132. The first filling material layer 162 is filled in the first groove G1.

The second component 201 may be same as or similar to the first component 101. Specifically, the second component 201 has a contour same as the first component 101 in top view. The second dielectric layer 220 of the second component 201 is bonded to the first dielectric layer 120. The second conductive structure 230 is in the second dielectric layer 220, and includes a second conductive pad 231 and a second conductive line 232. The second conductive pad 231 is bonded to the first conductive pad 131, and the second conductive line 232 is on the second conductive pad 231. The second groove G2 is joined to the first groove G1, wherein the second groove G2 surrounds the second conductive pad 231 and exposes a bottom surface S232 of the second conductive line 232. The second filling material layer 262 is in the second groove G2 and is in contact with the second conductive line 232.

In some embodiments, the top surface S162 of the first filling material layer 162, the top surface S131 of the first conductive pad 131, the bottom surface S262 of the second filling material layer 262, and the bottom surface S231 of the second conductive pad 231 are coplanar. As shown in FIG. 9, the first filling material layer 162 and the second filling material layer 262 in combination form an integrated ring to encircle the bonded first conductive pad 131 and the second conductive pad 231. Specifically, the bonded first conductive pad 131 and the second conductive pad 231 are sealed with the first filling material layer 162 and the second filling material layer 262. When temperature rises, the conductive structures 130 and 230 including metal material expand more than the dielectric layers 120 and 220 since their Coefficient of Thermal Expansion (CTE) are greater than the CTE of the dielectric layers 120 and 220. In some embodiments, the first filling material layer 162 and the second filling material layer 262 include soft material such that they can absorb the stresses generated from the expansion of the conductive structures. Therefore, the issues of damages and delamination of bonded dielectric layers can be prevented. In some examples, the first filling material layer 162 and the second filling material layer 262 include carbon contained material such as benzocyclobutene (BCB).

Figure 10:
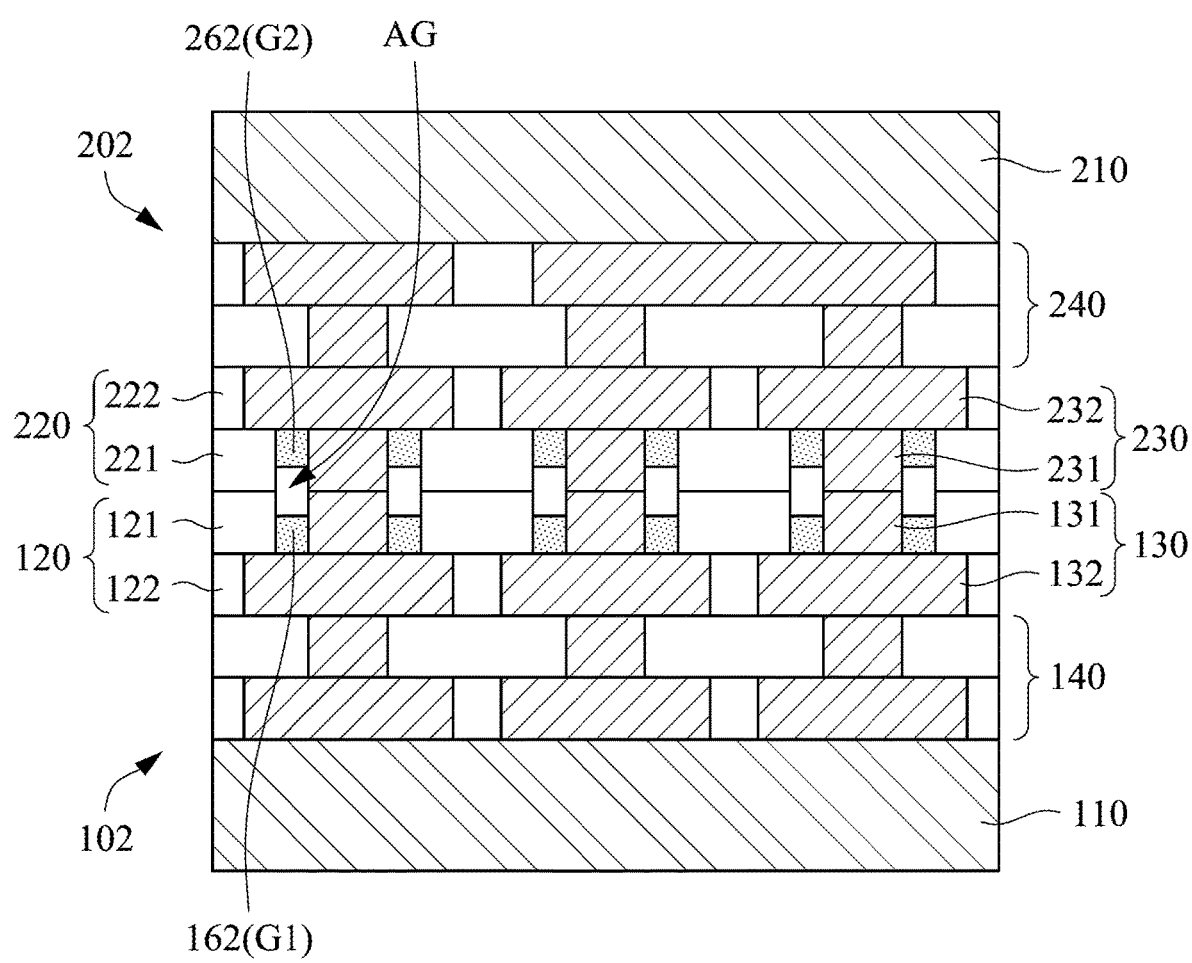

FIG. 10 illustrates a cross-sectional view of a semiconductor structure 400 according to some embodiments of the present disclosure. The semiconductor structure 400 includes a first component 102 and a second component 202. The first component 102 and the second component 202 may be same as or similar to each other. Specifically, the second component 202 may have a contour same as the first component 102 in top view. The difference between the semiconductor structure 400 and the semiconductor structure 300 shown in FIG. 9 is that the semiconductor structure 400 further includes an air gap AG between the first filling material layer 162 and the second filling material layer 262. The air gap AG extends from the first groove G1 to the second groove G2, and encircles a portion of the bonded first conductive pad 131 and second conductive pad 231. The air gap AG can provide spaces for the conductive structures 130 and 230 to expand. The first filling material layer 162 and the second filling material layer 262 including soft material can absorb the stresses generated from the expansion of the conductive structures. Therefore, the issues of damages and delamination of bonded dielectric layers can be prevented. It is noted that the air gap AG are not necessarily filled with air, it may be filled with other types of gases, or may be vacuumed. In other embodiments, the first component 101 may be bonded to the second component 202, or the first component 102 may be bonded to the second component 201.

As described above, according to the embodiments of the present disclosure, a semiconductor structure and a method of manufacturing thereof are provided. In the semiconductor structure of the present disclosure, the filling material layers surround the conductive pads and absorb the stress generated from the expansion of the conductive structure. In some examples, the filling material layers are partially filled in the grooves, and an air gap is formed between the filling material layers. The air gap can provide free spaces for the expansion of the conductive structure. Compared with the current semiconductor structure, the semiconductor structure of the present disclosure can prevent the issues of damages and delamination of bonded dielectric layers.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A semiconductor structure, comprising:
 a first component comprising:
  a first dielectric layer;
  a first conductive structure in the first dielectric layer, wherein the first conductive structure comprises a first conductive line and a first conductive pad on the first conductive line; and
  a first filling material layer on the first conductive line and surrounding the first conductive pad; and
 a second component bonded to the first component, comprising:
  a second dielectric layer directly in contact with the first dielectric layer;
  a second conductive structure in the second dielectric layer, wherein the second conductive structure comprises a second conductive pad and a second conductive line, the second conductive pad is directly in contact with the first conductive pad, and the second conductive line is on the second conductive pad; and
  a second filling material layer surrounding the second conductive pad and in contact with the second conductive line.

2. The semiconductor structure of claim 1, wherein the first conductive pad and the second conductive pad respectively have a width that is smaller than a width of the first conductive line and the second conductive line.

3. The semiconductor structure of claim 1, wherein the first conductive pad is aligned with the second conductive pad, and the first filling material layer is aligned with the second filling material layer.

4. The semiconductor structure of claim 1, wherein a top surface of the first filling material layer, a top surface of the first conductive pad, a bottom surface of the second filling material layer, and a bottom surface of the second conductive pad are coplanar.

5. The semiconductor structure of claim 1, further comprising an air gap between the first filling material layer and the second filling material layer.

6. The semiconductor structure of claim 1, wherein the first filling material layer and the second filling material layer respectively have a width of about 0.1-2 µm.

7. The semiconductor structure of claim 1, wherein the first filling material layer and the second filling material layer respectively comprise soft material.

8. The semiconductor structure of claim 7, wherein the first filling material layer and the second filling material layer respectively comprise carbon contained material.

9. The semiconductor structure of claim 1, further comprising an active device electrically connected to the first conductive structure.

10. A method of manufacturing a semiconductor structure comprising:
    forming a first component, wherein the first component comprises:
        a first dielectric layer;
        a first conductive structure in the first dielectric layer, wherein the first conductive structure comprises a first conductive line and a first conductive pad on the first conductive line; and
        a first filling material layer surrounding the first conductive pad and in contact with the first conductive line;
    forming a second component, wherein the second component comprises:
        a second dielectric layer;
        a second conductive structure in the second dielectric layer, wherein the second conductive structure comprises a second conductive line and a second conductive pad on the second conductive line; and
        a second filling material layer surrounding the second conductive pad and in contact with the second conductive line; and
    bonding the first component to the second component, wherein the first conductive pad is directly in contact with the second conductive pad, and the first dielectric layer is directly in contact with the second dielectric layer.

11. The method of claim 10, wherein the first conductive pad and the second conductive pad respectively have a width that is smaller than a width of the first conductive line and the second conductive line.

12. The method of claim 10, wherein bonding the first component to the second component comprises aligning the first conductive pad with the second conductive pad, and aligning the first filling material layer with the second filling material layer.

13. The method of claim 10, wherein the first filling material layer has a top surface that is level with a top surface of the first conductive pad, and the second filling material layer has a top surface that is level with a top surface of the second conductive pad.

14. The method of claim 10, wherein the first filling material layer has a height that is smaller than a height of the first conductive pad, and the second filling material layer has a height that is smaller than a height of the second conductive pad.

15. The method of claim 10, wherein forming the first component comprises:
    forming a first precursor structure comprising a first dielectric material and the first conductive structure in the first dielectric material, wherein the first dielectric material has a first surface that is level with a top surface of the first conductive pad;
    etching a first dielectric material to form a first groove surrounding the first conductive pad and exposing a top surface of the first conductive line;
    filling the first groove with a first filling material; and
    removing a portion of the first filling material to form the first filling material layer.

16. The method of claim 10, wherein forming the second component comprises:
    forming a second precursor structure comprising a second dielectric material and the second conductive structure in the second dielectric material, wherein the second dielectric material has a second surface that is level with a top surface of the second conductive pad;
    etching a second dielectric material to form a second groove surrounding the second conductive pad and exposing a top surface of the second conductive line;
    filling the second groove with a second filling material; and
    removing a portion of the second filling material to form the second filling material layer.

* * * * *